United States Patent [19]

Leipold

[11] 4,121,965

[45] Oct. 24, 1978

[54] METHOD OF CONTROLLING DEFECT ORIENTATION IN SILICON CRYSTAL RIBBON GROWTH

[75] Inventor: Martin H. Leipold, La Canada, Calif.

[73] Assignee: The United States of America as represented by the Administrator of the National Aeronautics & Space Administration, Washington, D.C.

[21] Appl. No.: 706,073

[22] Filed: Jul. 16, 1976

[51] Int. Cl.² .................. B01J 17/18; C01B 33/02
[52] U.S. Cl. ..................... 156/608; 156/617 SP; 156/DIG. 64; 156/DIG. 65; 156/DIG. 88
[58] Field of Search ............ 156/DIG. 64, DIG. 88, 156/DIG. 65, 608, 617 SP; 23/273 SP

[56] References Cited

U.S. PATENT DOCUMENTS

| B 584,997 | 3/1976 | Cizzek | 156/608 |
|---|---|---|---|
| 2,961,305 | 11/1960 | Dash | 156/608 |
| 3,130,040 | 4/1964 | Faust | 156/617 SP |
| 3,341,361 | 9/1967 | Gorski | 156/DIG. 88 |
| 3,591,348 | 7/1971 | La Belle, Jr. | 156/608 |
| 3,759,671 | 9/1973 | Bleil | 156/608 |
| 3,977,934 | 8/1976 | Lesk | 156/608 |

FOREIGN PATENT DOCUMENTS

| 913,674 | 12/1962 | United Kingdom | 156/617 SP |
|---|---|---|---|
| 938,917 | 10/1963 | United Kingdom | 156/DIG. 65 |

OTHER PUBLICATIONS

Dash, Growth of Silicon Crystals Free From Dislocations, J. of App. Phys., vol. 30, #4, Apr. 1959, pp. 459–474.
Barrett, "Growth of Wide, Flat Crystals of Silicon Web, J. Electro. Chem. Soc., Solid State Sci., Jun. 1971, vol. 118, #6, pp. 952–957.

Primary Examiner—Stephen J. Emery
Attorney, Agent, or Firm—Monte F. Mott; Wilfred Grifka; Robert Kinberg

[57] ABSTRACT

The orientation of twinning and other effects in silicon crystal ribbon growth is controlled by use of a starting seed crystal having a specific {110} crystallographic plane and <112> crystallographic growth direction.

1 Claim, 2 Drawing Figures

METHOD OF CONTROLLING DEFECT ORIENTATION IN SILICON CRYSTAL RIBBON GROWTH

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; U.S.C. 2457).

BACKGROUND OF THE INVENTION

This invention relates to thick film silicon growth techniques.

An important photovoltaic device useful in the direct conversion of solar energy into electrical power is the silicon solar cell, but its use on a large commercial scale has not been feasible due to the lack of an industrially feasible process for the growth of single crystal silicon directly and continuously from a melt. A method which has been most successful is an edge-defined, film-fed growth (EFG) process by which crystals may be grown with their thickness and width defined and controlled by the outside dimensions of a die.

The EFG process employs two spaced apart sheets of suitable material partially immersed in a silicon melt. The silicon melt wets the sheets and rises to the top of the sheets by capillary action. A single-crystal silicon seed is brought into contact with the melt to initiate crystallization. After proper adjustment of the melt temperature, crystal withdrawal rate, and crystallization spread across the top of the sheets through their full width, a ribbon of crystal can be grown of indefinite length. This spreading across the top of the sheets is halted by the sharp change in the effective contact angle at the outer perimeter of the ends of the sheets. The result is a thick film silicon crystal ribbon the thickness and width of which are defined by the perimeter of the ends of the sheets.

To better control the thickness of the silicon crystal ribbon, it has been suggested that the sheets be beveled to provide two sharp ends, i.e., to provide only sharp edges wetted by the silicon melt. The perimeter of the ends of the sheets is thus defined by the two parallel edges at the upper ends of the beveled sheets. In other words, by reducing the outer surfaces wetted by the silicon melt to sharp edges, the silicon crystal formed is virtually restricted in thickness to the space between the sheets.

A problem with the EFG process is the random occurrence of twinning and other effects as the silicon ribbon is grown. When twinning occurs in a direction parallel to the length of the ribbon, the ribbon is better for the manufacture of solar cells, but when twinning occurs randomly, and in an uncontrolled manner so that there are different orientations of the twinning defects along the length of the ribbon, that portion of the ribbon is poorer and is discarded.

The defect called twinning is evidenced by replication of crystal planes in mirror image formations. As much as 5 feet of ribbon may be crystallized before twinning stabilizes in the preferred direction parallel to the length of the ribbon and normal to the crystallographic plane. Since ribbon growth is a slow process, such loss of ribbon is costly because of the substantial loss of process time and the unnecessary wear on the walls of the die surrounding the opening imposed by the passage of the hot, corrosive liquid silicon. The latter affects both configuration and dimension of the opening in time so that the die must be replaced. A ribbon growing technique which would reduce or eliminate the uncontrolled orientation of the twinning effect would be of considerable advantage.

SUMMARY OF THE INVENTION

In accordance with the present invention, anomalous crystallographic developments, particularly twinning, are obtained in the preferred direction by seeding with $\{110\}<112<$ crystals. Any other orientation results in a complete breakdown on the ribbon structure before the anomalies stabilize in the preferred direction. The $\{110\}<112>$ crystal seed may be a single crystal, or may be a crystal with anomalies in the preferred direction. In the case of the latter, the initial structure of the ribbon will generally be a direct continuation of the seed structure. In the case of twinning in the seed, the same spacing between the twinning planes is maintained in the crystal ribbon grown. This allows control of spacing between the twinning planes in all crystal ribbon grown once a seed with the desired spacing is obtained.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
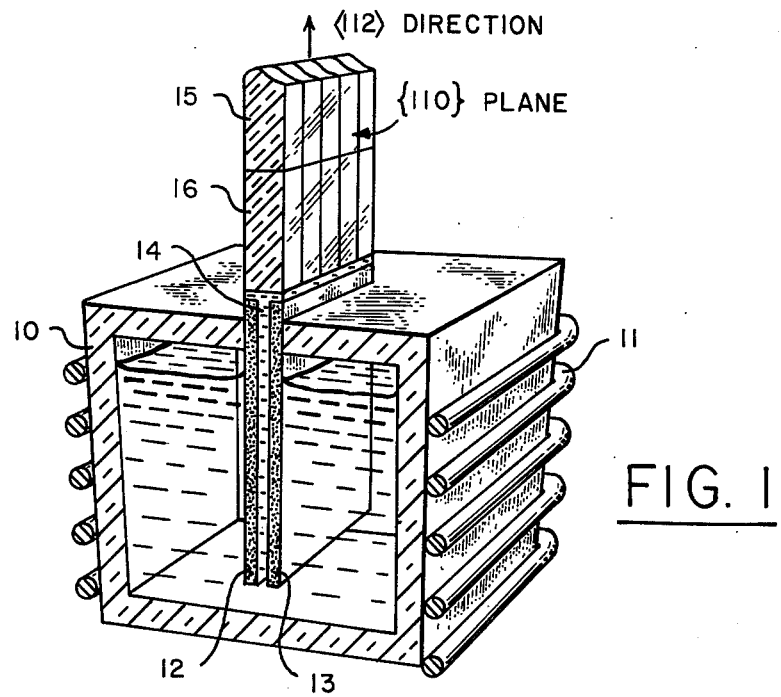
FIG. 1 is a schematic sectional drawing of a crucible and die arrangement for edge-defined, film-fed growth of silicon ribbon.

Referring now to FIG. 1, the EFG process by which silicon crystals may be grown is generally practiced with a crucible 10 made of refractory material such as quartz (silicon dioxide) or silicon nitride heated, as by an RF coil 11, to produce a melt (silicon solution). Two sheets of silicon carbide 12 and 13 are semi-immersed in the melt. The sheets are spaced sufficiently close to each other to make the liquid silicon rise by capillary force and wet a slot 14 between their upper edges. A silicon seed crystal is then brought into contact with the liquid silicon in the slot. After the mutual effects of melt temperature, withdrawal rate, and crystallization spread across the top of the sheets have been properly adjusted, the silicon crystal can be grown in a ribbon of indefinite length. The growth of the silicon crystal ribbon is established in thickness and width by the upper horizontal surfaces of the sheets. It is for that reason that the sheets are commonly referred to as a "die." The die accurately controls the crystal ribbon cross section. Growth rate is limited only by the rate at which heat can be removed from the solid-liquid interface.

Orientation of anomalies, such as twinning, can be stabilized immediately at the beginning of the growth process by starting ribbon growth with a seed crystal 15 having the anomalies oriented with respect to one specific plane and direction, namely $\{110\}$ and $<112<$. This seed crystal orientation has been proven successful for controlling twinning direction parallel to the ribbon edges and perpendicular to the crystal plane by actual fabrication of ribbon.

FIG. 1 illustrates a length of grown crystal 16 withdrawn from the die after the seed crystal. The vertical lines on the {110} plane of the seed crystal and the grown crystal represent the interfaces of crystal planes in mirror image formations, the evidence of the so-called twinning anomaly. This orientation is determinable by conventional X-ray diffraction techniques. The crystallographic direction <112< is in the direction of crystal growth.

As shown in FIG. 1, the twinning anomaly present in the preferred orientation in the seed crystal is generally continued in the grown crystal. Other anomalies, such as crystal dislocations, will be similarly controlled in orientation. That reduces or eliminates uncontrolled orientation of the anomalies, and significantly reduces loss of grown crystal. The substantial reduction in any loss of process time reduces wear on the die. With such significant reduction in the wear on the die, the die can be sharply beveled as in the alternative arrangement of FIG. 2 to better define the thickness of the grown crystal ribbon. The use of a beveled edge in a conventional capillary EFG for better definition of the crystal thickness has been reported in the literature by others.

Figure 2:
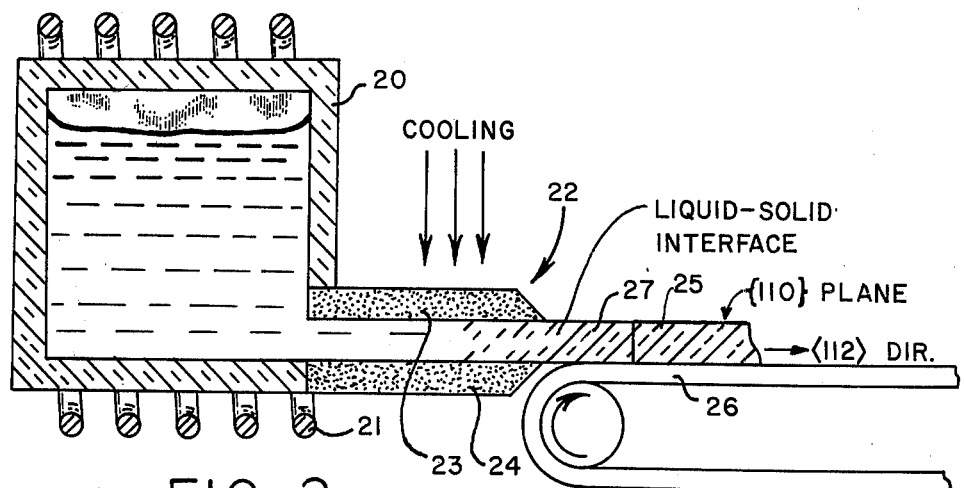
FIG. 2 is a schematic sectional drawing of an alternative crucible and die arrangement for growth of silicon ribbon in which the die is not wetted by the silicon melt.

Referring now to FIG. 2, which illustrates an inverted Stepanov technique, a quartz crucible 20 is heated, as by an RF coil 21, and liquid silicon is fed through a "nozzle" 22 formed by two horizontal and beveled slabs 23 and 24 spaced apart the desired thickness of the crystal ribbon. The fine edges of the beveled slabs define the limits of the liquid silicon. A seed crystal 25 is brought in contact with the melt. After adjustment of the crucible temperature for the cooling rate of the nozzle, the seed crystal is drawn away from the nozzle, as by a moving belt 26. The growth of a silicon crystal ribbon 27 is then established. The established rate of growth is maintained by controlling the rate of cooling and the rate of moving the belt to maintain the liquid-solid interface at the tip of the nozzle even as the melt is used, until there is not sufficient melt to keep the nozzle full.

The silicon crystal ribbon grown by this process, an inverted Stepanov process, differs from the more conventional Stepanov process only in that the slabs are placed at the bottom of the crucible instead of the top in order that capillary forces that feed the nozzle be aided by the pressure head of the liquid silicon in the crucible. In every one of these techniques, the orientation of anomalies is controlled by using a starting seed crystal having a specific {110} crystallographic plane and <112< crystallographic direction. If such a seed crystal is not used, anomalies can occur randomly and in an uncontrolled manner so that there are different orientations of the anomalies along the length of ribbon. As much as 5 feet of ribbon crystal may be grown before the anomalies stabilize in the preferred orientation. That portion of the ribbon cannot be used for manufacture of solar cells and is discarded.

what is claimed is:

1. In a film-fed process of growing crystalline silicon in a ribbon form by drawing molten silicon through a die, starting crystallization of silicon thus fed through said die as it cools with a seed crystal, and continuing to pull the crystal ribbon thus formed from said die as crystallization continues, the improvement consisting of using as said seed crystal a rectangular crystalline silicon of appropriate dimensions having a {110} crystallographic plane parallel to the broad surfaces of the seed and the ribbon grown, a <112< crystallographic direction parallel to the direction of growth of said crystal ribbon, and {111} twinning planes parallel to said growth direction and normal to said broad surfaces.

* * * * *